US008822337B2

(12) United States Patent
Zhu

(10) Patent No.: US 8,822,337 B2
(45) Date of Patent: Sep. 2, 2014

(54) TWO-SIDED SEMICONDUCTOR STRUCTURE

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 56 days.

(21) Appl. No.: 13/607,676

(22) Filed: Sep. 8, 2012

(65) Prior Publication Data

US 2012/0329277 A1     Dec. 27, 2012

Related U.S. Application Data

(62) Division of application No. 12/700,409, filed on Feb. 4, 2010, now Pat. No. 8,299,583.

(51) Int. Cl.
*H01L 21/768* (2006.01)

(52) U.S. Cl.
USPC ............. 438/667; 438/154; 438/199; 257/52; 257/621; 257/E21.577

(58) Field of Classification Search
CPC ................................................ H01L 21/76898
See application file for complete search history.

(56) References Cited

U.S. PATENT DOCUMENTS

| 7,485,508 | B2 | 2/2009 | Dyer et al. |
| 8,018,031 | B2 | 9/2011 | Yanagida et al. |
| 2005/0067620 | A1 | 3/2005 | Chan et al. |
| 2005/0082626 | A1 | 4/2005 | Leedy |
| 2005/0105371 | A1 | 5/2005 | Johnson et al. |
| 2005/0167782 | A1* | 8/2005 | Sanchez et al. ............... 257/532 |
| 2007/0145367 | A1 | 6/2007 | Chen et al. |

* cited by examiner

*Primary Examiner* — Mamadou Diallo
(74) *Attorney, Agent, or Firm* — Scully, Scott, Murphy & Presser, P.C.; H. Daniel Schnurmann

(57) ABSTRACT

Deep via trenches and deep marker trenches are formed in a bulk substrate and filled with a conductive material to form deep conductive vias and deep marker vias. At least one first semiconductor device is formed on the first surface of the bulk substrate. A disposable dielectric capping layer and a disposable material layer are formed over the first surface of the bulk substrate. The second surface, located on the opposite side of the first surface, of the bulk substrate is polished to expose and planarize the deep conductive vias and deep marker vias, which become through-substrate vias and through-substrate alignment markers, respectively. At least one second semiconductor device and second metal interconnect structures are formed on the second surface of the bulk substrate. The disposable material layer and the disposable dielectric capping layer are removed and first metal interconnect structures are formed on the first surface.

20 Claims, 12 Drawing Sheets

US 8,822,337 B2

TWO-SIDED SEMICONDUCTOR STRUCTURE

CROSS REFERENCE TO RELATED APPLICATION

This application is a divisional of U.S. patent application Ser. No. 12/700,409, filed Feb. 4, 2010 the entire content and disclosure of which is incorporated herein by reference.

FIELD OF THE INVENTION

The present invention relates to semiconductor structures including semiconductor devices on both sides of a semiconductor substrate and methods of manufacturing the same.

BACKGROUND

Three-dimensional integration of semiconductor chips typically employs through-substrate vias (TSV's) that connect the front side of a semiconductor chip to a back side of the same semiconductor chip. Multiple semiconductor chips may be vertically stacked employing the through-substrate vias (TSV's). Such three-dimensional integration of semiconductor chips provides a higher device density per area than a single semiconductor chip without any vertical stacking, and reduces the size of a packaging substrate correspondingly.

While such benefits of three-dimensional integration of semiconductor chips are generally known, vertical stacking of multiple semiconductor chips requires die-to-die, die-to-wafer, or wafer-to-wafer alignment. Depending on the precision of the tool employed for such alignment, the overlay tolerance of the vertical stacking process may be from 0.5 microns to 5 microns, which must be considered into design to insure electrical functionality of stacked semiconductor chips. Specifically, the lateral dimensions of the through-substrate vias must be greater than the overlay tolerance of the tool employed for lateral alignment of multiple semiconductor chips. The feature size of the through-substrate vias is limited to dimensions greater than the overlay tolerance. While it is possible to reduce the overlay tolerance by employing accurate alignment tools, such tools are typically costly.

Further, the device density per single semiconductor chip is the same for stacked semiconductor chips and for non-stacked semiconductor chips. Thus, a minimum substrate area is required per each semiconductor device. In other words, while the areal device density in a vertical stack of semiconductor chips may be greater than the areal density of a non-stacked single semiconductor chip, the device density per substrate is the same. Thus, the cost of an initial (unprocessed) substrate per semiconductor device is the same between three-dimensionally stacked semiconductor chips and a non-stacked semiconductor chip.

In view of the above, there is a continuing need for a semiconductor structure that provides a high areal density at a low manufacturing cost.

SUMMARY

The present invention provides a semiconductor structure through-substrate vias and a buried conductive layer embedded in a semiconductor substrate. At least one first semiconductor device is formed above the buried conductive layer and at least one second semiconductor device is formed beneath the buried conductive layer.

A buried conductive layer is formed in a bulk substrate by ion implantation. Deep via trenches and deep marker trenches are formed in a bulk substrate and filled with a conductive material to form deep conductive vias and deep marker vias. At least one first semiconductor device is formed on the first surface of the bulk substrate. A disposable dielectric capping layer and a disposable material layer are formed over the first surface of the bulk substrate to encapsulate the at least one first semiconductor device. The disposable material layer may function as a handle substrate. A second surface, located on an opposite side of the first surface, of the bulk substrate is polished to expose and planarize the deep conductive vias and deep marker vias, which become through-substrate vias and through-substrate alignment markers, respectively. At least one second semiconductor device and second metal interconnect structures are formed on the second surface of the bulk substrate. The disposable material layer and the disposable dielectric capping layer are removed and first metal interconnect structures are formed on the first surface. Contacts to the buried conductive layer may also be formed.

According to an aspect of the present invention, a semiconductor structure is provided, which includes: a first semiconductor device located on a first surface of a semiconductor substrate; a second semiconductor device located on a second surface of the semiconductor substrate, wherein the second surface is located opposite to the first surface; and a through-substrate via (TSV) extending from the first surface to the second surface, wherein a first end surface of the TSV is substantially coplanar with the first surface and a second end surface of the TSV is substantially coplanar with the second surface.

According to another aspect of the present invention, a method of forming a semiconductor structure is provided, which includes forming a through-substrate via (TSV) in a semiconductor substrate; forming a first semiconductor device on a first surface of a semiconductor substrate; forming a disposable material layer on the first semiconductor device; forming a second semiconductor device on a second surface of the semiconductor substrate, wherein the second surface is located opposite to the first surface; and removing the disposable material layer after forming the second semiconductor device.

BRIEF DESCRIPTION OF THE DRAWINGS

FIG. 2 is a vertical cross-sectional view and FIG. 3 is a top-down view. The plane A-A' represent the plane of the vertical cross-sectional view of FIG. 2.

FIG. 7 is a vertical cross-sectional view and FIG. 8 is a top-down view. The plane A-A' represent the plane of the vertical cross-sectional view of FIG. 7.

DETAILED DESCRIPTION

Figure 1:
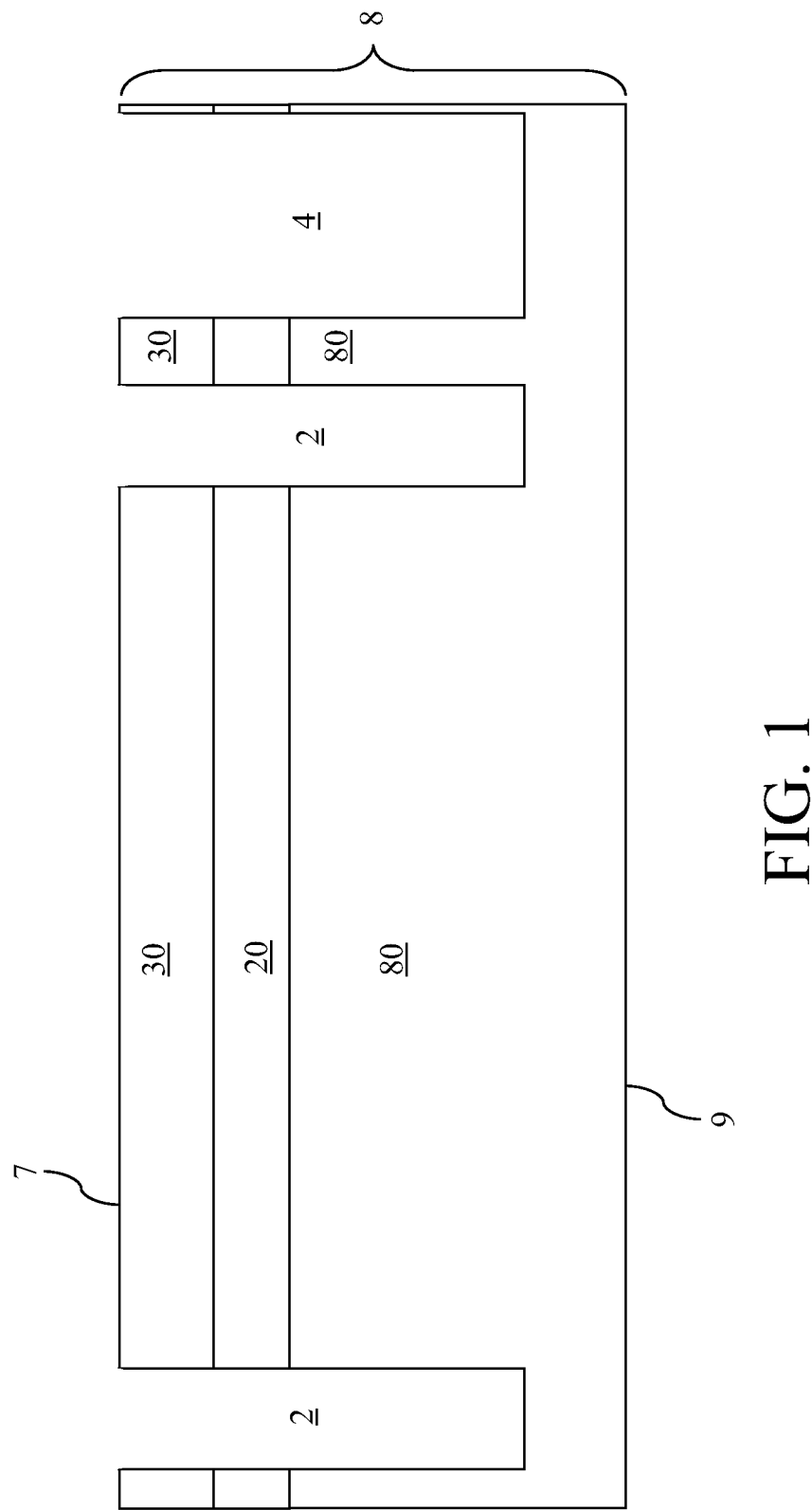
FIG. 1 is a vertical cross-sectional view of an exemplary semiconductor structure after formation of a buried conductive layer, deep via trenches, and a deep marker trench according to the present invention.

As stated above, the present invention relates to semiconductor structures including semiconductor devices on opposing pair of surfaces, i.e., both sides, of a semiconductor substrate and methods of manufacturing the same, which is now described in detail with accompanying figures. Like and corresponding elements are referred to by like reference numerals.

Referring to FIG. 1, a buried conductive layer 20 is formed in a semiconductor substrate 8. The semiconductor substrate 8 is a bulk substrate including a semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Preferably, the entirety of the semiconductor material within the semiconductor substrate 8 is single crystalline material, i.e., has an epitaxial atomic alignment throughout.

The buried conductive layer 20 is formed between the first surface 7 of the semiconductor substrate 8 and the second surface 9 of the semiconductor substrate 8. For example, the buried conductive layer 20 may be formed by ion implantation of p-type dopants or n-type dopants into a semiconductor substrate that is substantially undoped or doped at a low dopant concentration of $1.0 \times 10^{18}/cm^3$ or less. Typically, the dopant concentration of the buried conductive layer 20 is greater than $1.0 \times 10^{18}/cm^3$. In case the buried conductive layer 20 is formed by ion implantation, the distance between the buried conductive layer 20 and the first surface 7 of the semiconductor substrate is from 0.2 micron to 2 micron.

The semiconductor substrate 8 forms a vertical stack of a first semiconductor layer 30, the buried conductive layer 20, and a second semiconductor layer 80. The first semiconductor layer 30 is located on a first side of the buried conductive layer 20, and a second semiconductor layer 80 located on a second side of the buried conductive layer 20. The second side is the opposite side of the first side. The first semiconductor layer 30, the second semiconductor layer 80, and the buried conductive layer 20 comprise the same semiconductor material. The entirety of the first semiconductor layer 30, the second semiconductor layer 80, and the buried conductive layer 20 are single crystalline and epitaxially aligned amongst one another. The buried conductive layer 20 may be employed to electrically ground the first semiconductor layer 30 and the second semiconductor layer 80. If the first semiconductor layer 30 and the second semiconductor layer 80 have a p-type doping or an n-type doping, the buried conductive layer 20 is preferably doped with dopants of the same conductivity type as the first semiconductor layer 30 and the second semiconductor layer 80 to avoid formation of p-n junctions and to prevent loss of electrical potential across such a p-n junction.

Alternately, the semiconductor substrate 8 including a vertical stack of a first semiconductor layer 30, a buried conductive layer 20, and a second semiconductor layer 80 may be formed by providing a prototype substrate including a stack of a prototype buried conductive layer and a second semiconductor layer 80. An epitaxial layer having a lower dopant concentration than the prototype buried conductive layer is formed directly on the prototype buried conductive layer by epitaxy to form a first semiconductor layer 30. As embedded between the first semiconductor layer 30 and the second semiconductor layer 80, the prototype buried conductive layer becomes "buried" to become a buried conductive layer 20. In this case, the thickness of the first semiconductor layer 30 may be from 0.2 micron to 20 microns, although lesser and greater thicknesses are also contemplated herein. The thickness of the semiconductor substrate 8 is typically from 500 microns to 1,000 microns, although lesser and greater thicknesses are also contemplated herein. The thickness of the semiconductor substrate 8 is the sum of the thicknesses of the first semiconductor layer 30, the thickness of the second semiconductor layer 80, and the thickness of the buried conductive layer 20.

At least one deep via trench 2 and at least one deep marker trench 4 are formed in the semiconductor substrate 8 from the first surface 7. The at least one deep via trench 2 and at least one deep marker trench 4 extend through the first semiconductor layer 30 and the buried conductive layer 20 and into the second semiconductor layer 80. The depth of the at least one deep via trench 2 and at least one deep marker trench 4 may be from 50 microns to 900 microns, and is less than the thickness of the semiconductor substrate 8. The horizontal cross-sectional areas of the at least one deep via trench 2 and at least one deep marker trench 4 may be substantially constant irrespective of the depth at which the cross-sectional view is taken. The at least one deep via trench 2 is intended to function as a fill area for at least one deep conductive via for transmission of electrical signals or power supply, and may have any cross-sectional shape. Preferably, the at least one deep marker trench 4 has a directional feature that may be use for alignment purposes in a lithographic stepper. For example, the cross-sectional area of the at least one marker trench 4 may be in the shaped of a crosshair.

Figure 2:
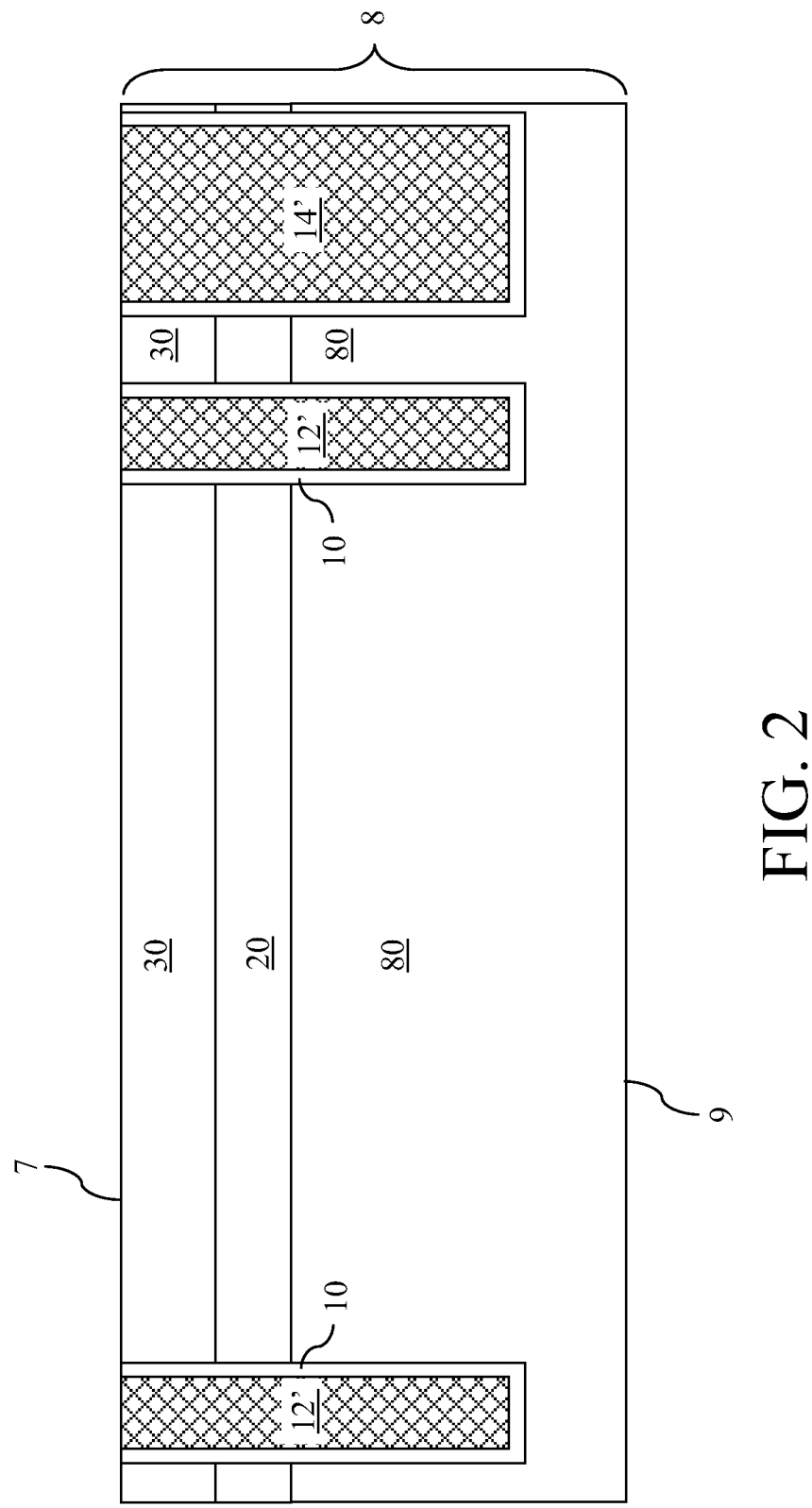
FIGS. 2 and 3 are views of the exemplary semiconductor structure after formation of deep conductive vias and a deep marker via.
Figure 3:
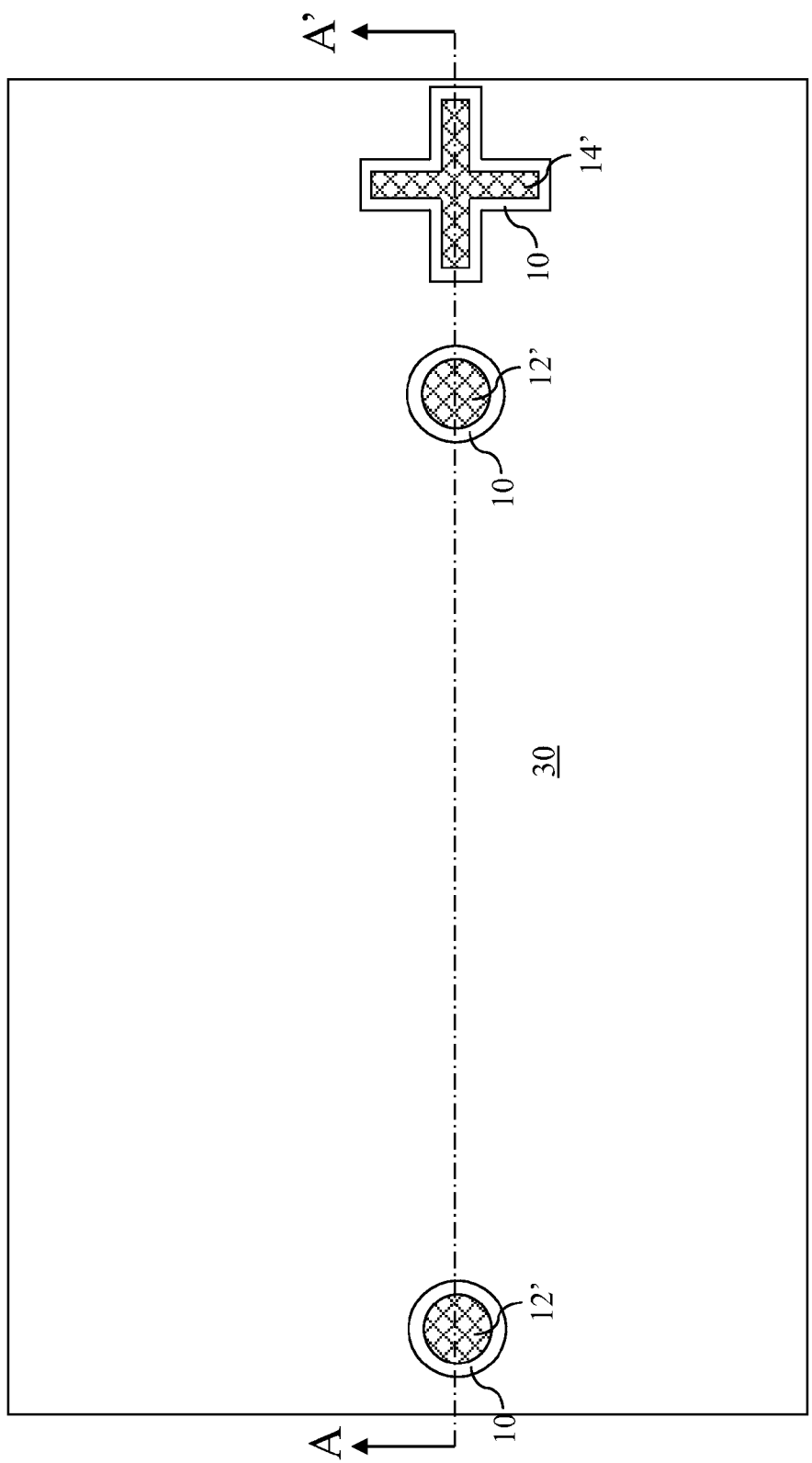

Referring to FIGS. 2 and 3, dielectric liners 10 are formed on the sidewalls and bottom surfaces of the at least one deep via trench 2 and at least one deep marker trench 4 as well as on the first surface 7 of the semiconductor substrate 8. FIG. 2 is a vertical cross-sectional view along the plane A-A' in FIG. 3, and FIG. 3 is a top-down view. The dielectric liners 10 include a dielectric material that electrically isolates a structure located inside of the dielectric liners 10 from a structure located outside of the dielectric liners 10. For example, the dielectric material of the dielectric liners 10 may be silicon oxide, silicon nitride, silicon oxynitride, a high dielectric constant (high-k) material including a dielectric metal oxide, or a combination thereof. The thickness of the dielectric liners 10 is less than half the narrowest width of the features in the cross-sectional area of the at least one deep via trench 2 and at least one deep marker trench 4 to prevent plugging of the at least one deep via trench 2 and at least one deep marker trench 4. The thickness of the dielectric liners 10 may be from 10 nm and 500 nm, and typically from 20 nm to 200 nm, although lesser and greater thicknesses are also contemplated herein.

Subsequently, a conductive material is deposited into the at least one deep via trench 2 and at least one deep marker trench 4. The conductive material may be a doped semiconductor material such as doped polysilicon or a doped silicon-containing semiconductor alloy, or may be a metallic material such as W, Al, Cu, Au, Ag, Ta, Ti, WN, TaN, TiN, or a combination thereof. The conductive material may be deposited by chemical vapor deposition (CVD), physical vapor deposition (PVD), electroless plating, electroplating, a combination thereof, or any equivalent deposition method. In general, any conductive material may be employed to fill the at least one deep via trench 2 and at least one deep marker trench 4. Preferably, a conductive material with high conductivity is preferred to reduce the RC delay in signal transmission through through-substrate vias (TSV's) to be subsequently formed from the conductive material. The thickness of the deposited conductive material is sufficient to completely fill the at least one deep via trench 2 and at least one deep marker trench 4.

The portion of the conductive material above the first surface 7 of the semiconductor substrate 8 is removed by planarization, a recess etch, or a combination thereof. Optionally, the portion of the dielectric liners 10 above the first surface 7 of the semiconductor substrate 8 may be employed as a stopping layer during the planarization process. Subsequently, the portion of the dielectric liners 10 above the first surface 7 of the semiconductor substrate 8 is removed to expose the first surface 7 of the semiconductor substrate 8, which is the exposed surface of the first semiconductor layer 30.

The remaining portion(s) of the at least one deep via trench 2 embedded in the semiconductor substrate 8 constitute(s) at least one deep conductive via 12'. A first end surface of each of the at least one deep conductive via 12' is substantially coplanar with the first surface 7 of the semiconductor substrate 8. A second end surface of each of the at least one deep conductive via 12' is embedded in the semiconductor substrate 8. The remaining portion(s) of the at least one deep marker trench 4 embedded in the semiconductor substrate 8 constitute(s) at least one deep marker via 14'. A first end surface of each of the at least one deep marker via 14' is substantially coplanar with the first surface 7 of the semiconductor substrate 8. A second end surface of each of the at least one deep marker via 14' is embedded in the semiconductor substrate 8.

The at least one deep conductive via 12' and the at least one deep marker via 14' comprise the same conductive material, and are laterally surrounded by the dielectric liners 10. Preferably, the at least one deep marker via 14' provides enough optical contrast against surrounding areas in the first surface 7 for alignment in a lithographic stepper during subsequent processing steps.

Figure 4:
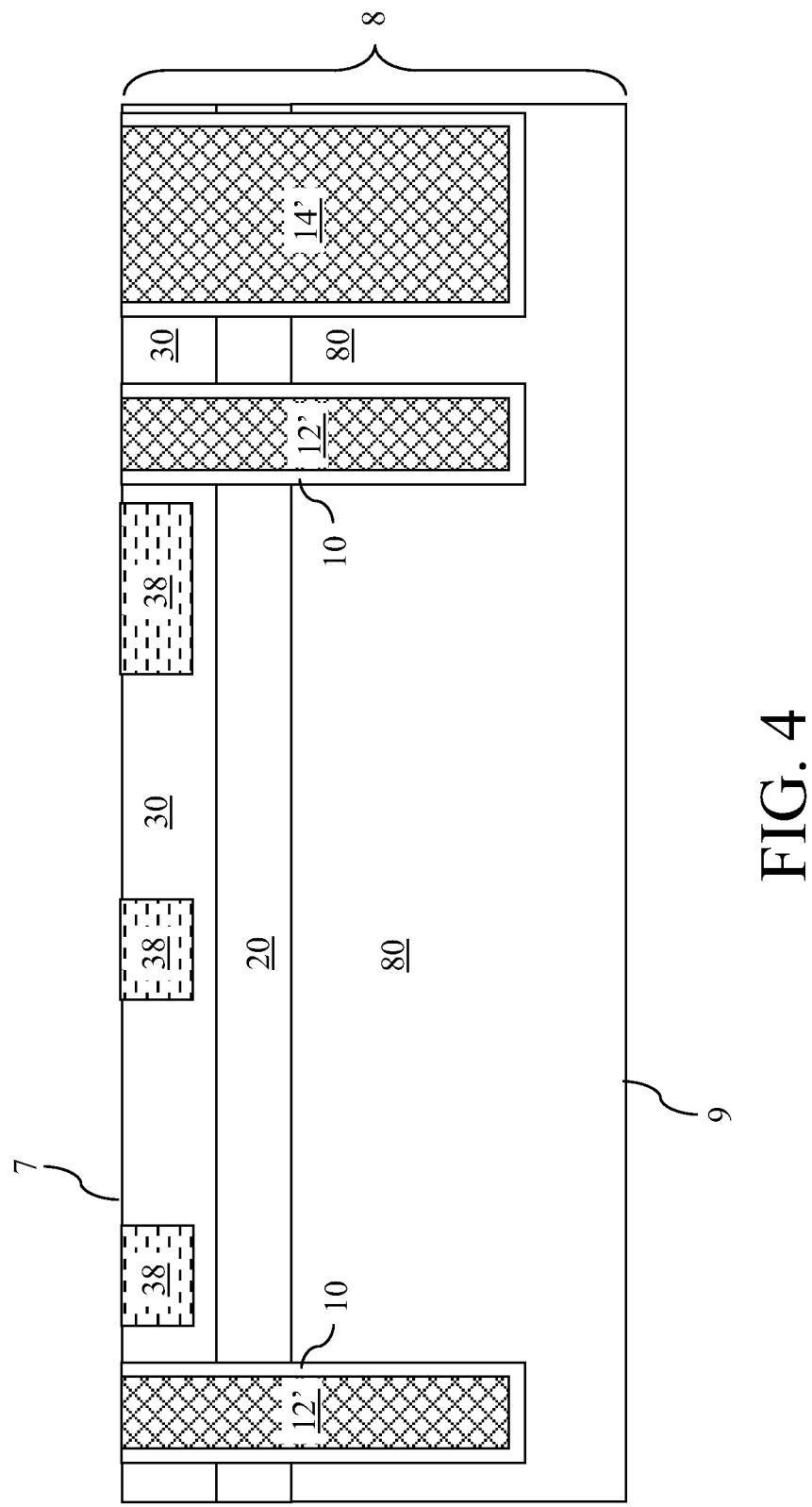
FIG. 4 is a vertical cross-sectional view of the exemplary semiconductor structure after formation of first shallow trench isolation structures according to the present invention.

Referring to FIG. 4, first shallow trench isolation (STI) structures 38 are formed on the first surface 7 of the semiconductor substrate 8. The first STI structures 38 may formed within the first semiconductor layer 30 by conventional methods. An exemplary processing sequence for formation of the first STI structures 38 include deposition of pad layers, application and lithographic patterning of a photoresist, transfer of the lithographic pattern into the pad layers and removal of the photoresist, transfer of the pattern in the pad layers into the first semiconductor layer 30 to form shallow trenches, deposition of a first STI material into the shallow trenches, removal of excess material above the pad layers, optional recessing of the first STI material, and the removal of the pad layers.

The remaining portions of the first semiconductor layer 30 that are not occupied by the first STI structures 38 include first active areas in which semiconductor devices are subsequently built. Typical dielectric materials that may be employed as the first STI material include silicon oxide, silicon nitride, and silicon oxynitride. Suitable STI liners may be formed as needed prior to filling the shallow trenches. In general, the top surfaces of the STI structures 38 are substantially coplanar with the first surface 7 of the semiconductor substrate 8. A non-zero step height between the top surfaces of the STI structures 38 and the first surface 7 of the semiconductor substrate 8 may be temporarily maintained during processing to minimize the final step height between the between the top surfaces of the STI structures 38 and the first surface 7 of the semiconductor substrate 8 at the end of the processing sequence.

Figure 5:
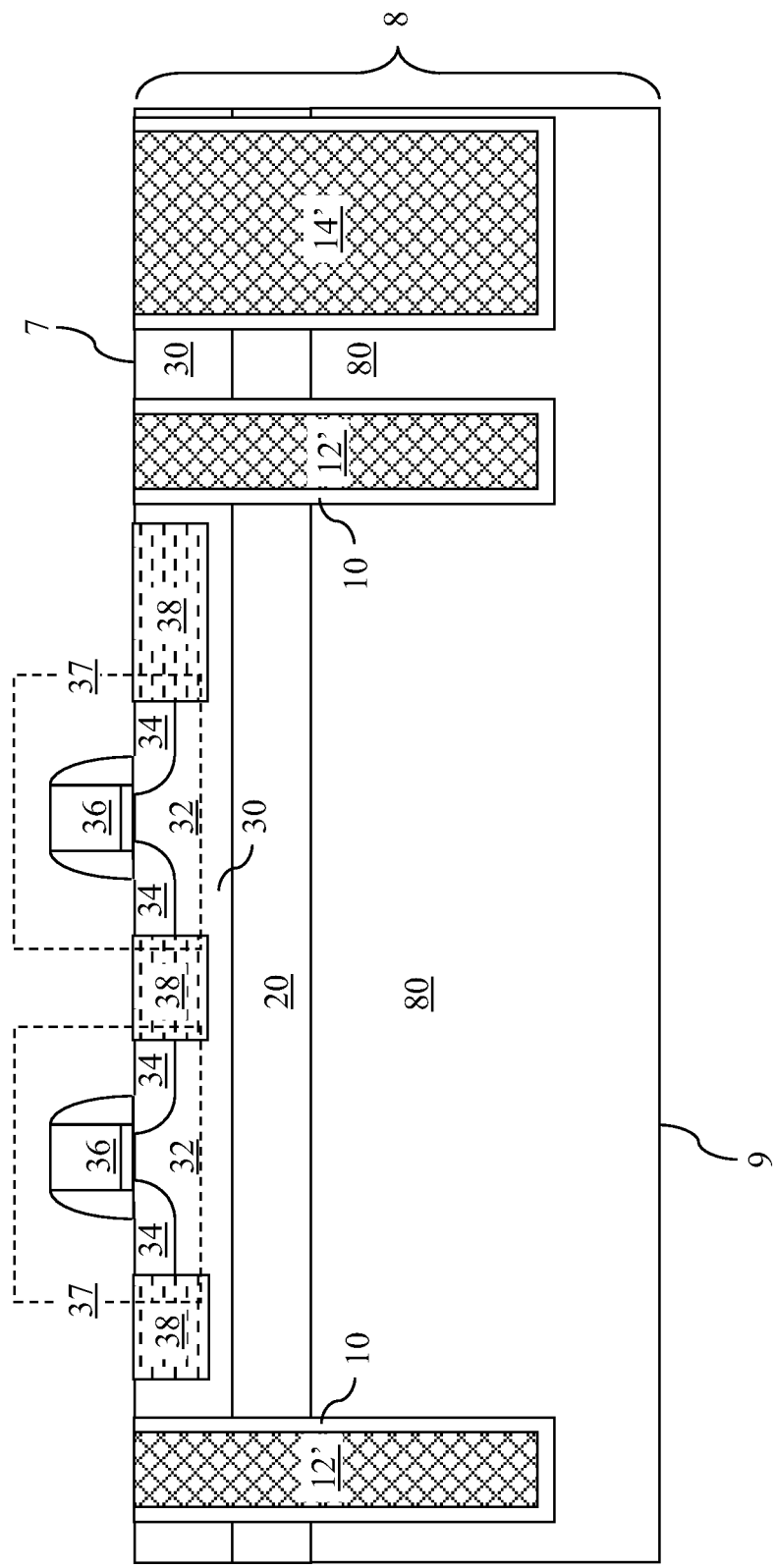
FIG. 5 is a vertical cross-sectional view of the exemplary semiconductor structure after formation of first semiconductor devices according to the present invention.

Referring to FIG. 5, at least one first semiconductor device 37 is formed on the first surface 7 of the semiconductor substrate 8. The at least one first semiconductor device 37 may include a field effect transistor, a bipolar transistor, a diode, a capacitor, a resistor, an inductor, a varactor, or a combination thereof. For example, the at least one first semiconductor device 37 may include first field effect transistors, each of which include a first body region 32, first source and drain regions 34, and a first gate electrode 36. First gate spacers comprising a dielectric material may be formed as needed. Each first body region 32 is a portion of the first semiconductor layer 30. The first semiconductor layer 30 may include p-doped semiconductor wells or n-doped semiconductor wells. Such doped semiconductor wells have a different dopant concentration than other portions of the first semiconductor layer 30.

First gate dielectrics and first gate electrodes 36 may be formed by deposition of a gate dielectric layer and a gate electrode layer, followed by lithographic patterning. The first source and drain regions 34 may be formed by employing block level masks and ion implantation of electrical dopants, i.e., p-type dopants and n-type dopants. The first gate spacers may be formed by deposition of a dielectric material layer followed by an anisotropic etch that removes horizontal portions of the dielectric material layer. The remaining vertical portions of the dielectric material layer constitute the first gate spacers. Preferably, the activation anneal of implanted dopants is postponed to a later processing step to minimize unnecessary thermal cycling at this point.

Figure 6:
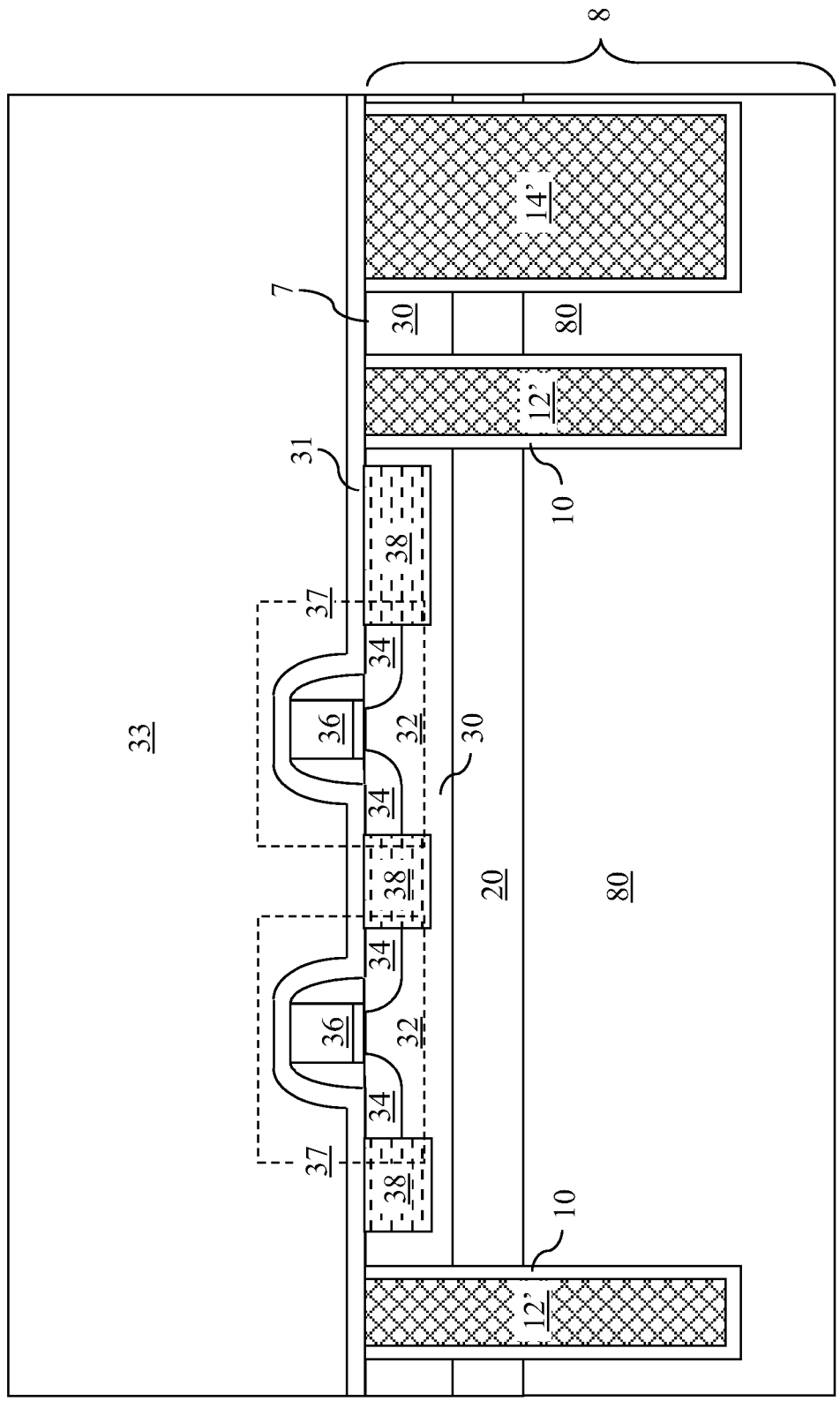
FIG. 6 is a vertical cross-sectional view of the exemplary semiconductor structure after formation of a disposable dielectric capping layer and a disposable material layer according to the present invention.

Referring to FIG. 6, a disposable dielectric capping layer 31 is formed directly on the first surface 7 of the semiconductor substrate 8 and the at least one first semiconductor device 37. The disposable dielectric capping layer 31 comprises a dielectric material such as silicon oxide, silicon nitride, silicon oxynitride, organosilicate glass (OSK), a spin-on low-k dielectric material having a dielectric constant less than 2.7, a high dielectric constant material including a metal oxide and having a dielectric constant greater than 8.0, or a combination thereof. Preferably, the dielectric material of the disposable dielectric capping layer 31 includes a different material than the material of the first STI structures 38 and the gate spacers, if present. The thickness of the disposable dielectric capping layer 31 may be from 20 nm to 500 nm, and typically from 40 nm to 200 nm, although lesser and greater thicknesses are also contemplated herein.

A disposable material layer 33 is formed on the disposable dielectric capping layer 31. The disposable material layer 33 includes a different material than the material of the disposable dielectric capping layer 31. The material of the disposable material layer 33 may be a semiconductor material such as polysilicon, amorphous silicon, a silicon-containing alloy, a germanium-containing material, or a compound semiconductor material. Alternately, the material of the disposable material layer 33 may be a metallic material or an insulator material provided that the material of the disposable material layer 33 may be removed selective to the material of the disposable dielectric capping layer 31.

In one embodiment, the disposable material layer 33 is employed to protect the at least one first semiconductor device 37 from mechanical damages during subsequent processing, while not being employed as a mechanical support structure for the semiconductor substrate 8. In this case, the thickness of the disposable material layer 33 may be from 0.5 micron to 50 microns, although lesser and greater thicknesses are also contemplated herein.

In another embodiment, the disposable material layer 33 is employed as a handle substrate that provides mechanical support to the semiconductor substrate 8 during a subsequent thinning of the semiconductor substrate. In this case, the thickness of the disposable material layer 33 may be from 10 microns to 400 micron, although lesser and greater thicknesses are also contemplated herein.

Figure 7:
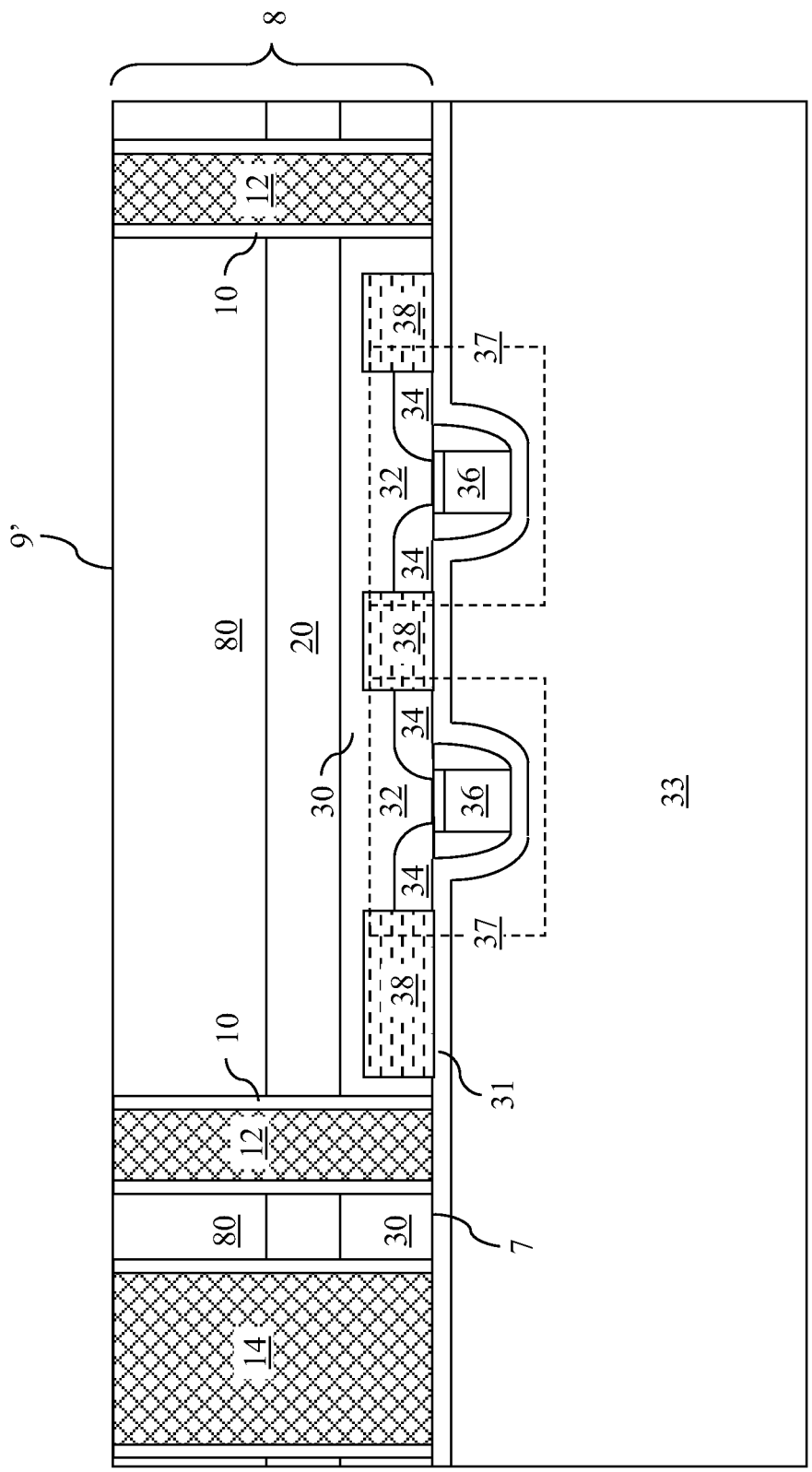
FIGS. 7 and 8 are views of the exemplary semiconductor structure after planarization of the second surface of the semiconductor substrate and formation of through-substrate vias and a through-substrate alignment marker.
Figure 8:
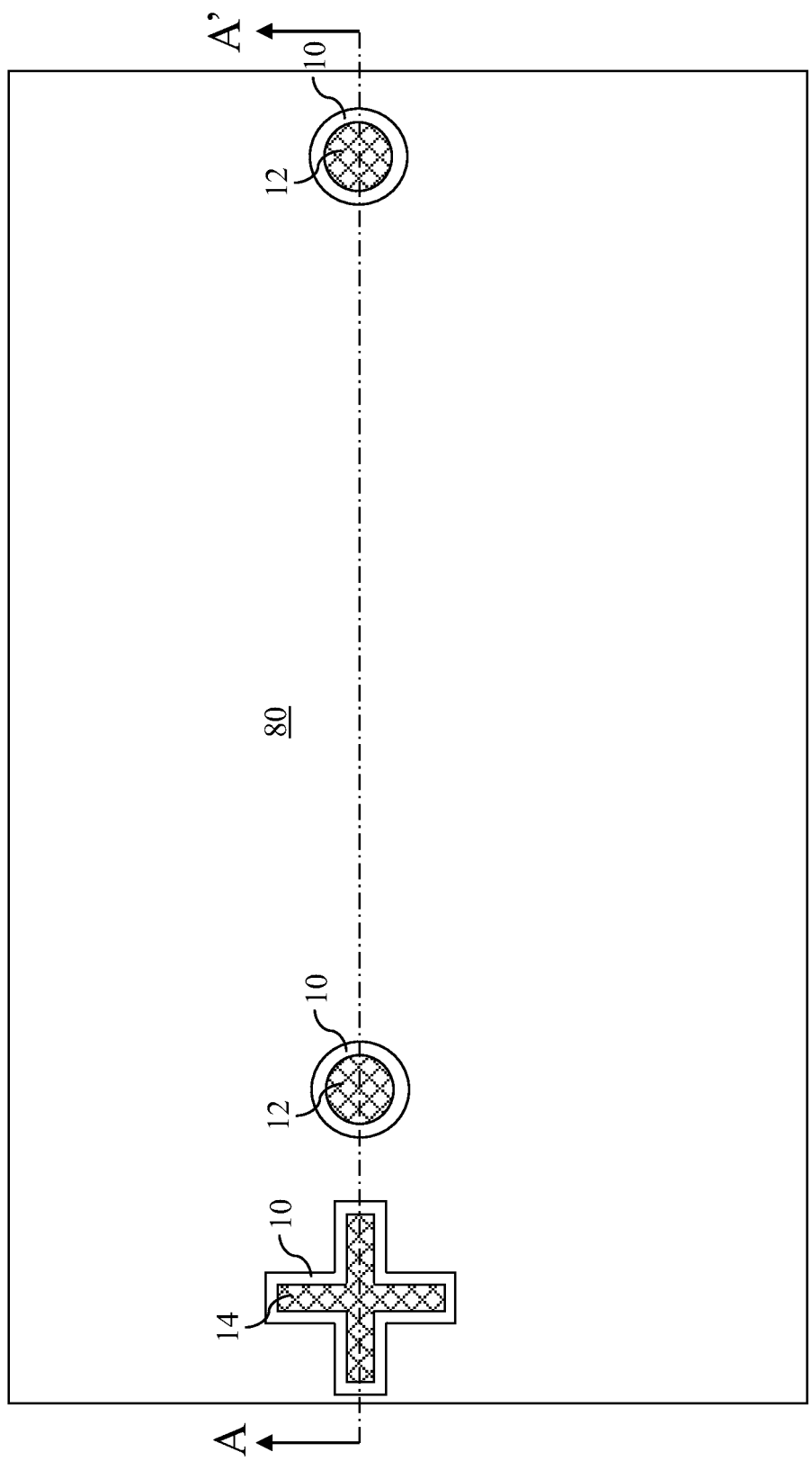

Referring to FIGS. 7 and 8, a bottom portion of the second semiconductor layer 80 is removed from the second surface 9 of the semiconductor substrate 8 to form at least one through-substrate via (TSV) 12 and at least one through-substrate alignment marker (TSAM) 14. FIG. 7 is a vertical cross-sectional view of the exemplary semiconductor structure after flipping the exemplary semiconductor structure upside down. The plane of the vertical cross-sectional view in FIG. 7 corresponds to the plane A-A' in FIG. 8. FIG. 8 is a top-down view after flipping the exemplary semiconductor substrate.

Specifically, the second surface 9 of the semiconductor substrate 8 is recessed by polishing, grinding, wet chemical etch, a dry etch, or a combination thereof. The second end surface of each of the at least one deep conductive via 12' is exposed and removed during the removal of the bottom portion of the second semiconductor layer 80. The remaining portion(s) of the at least one at least one deep conductive via 12' embedded in the semiconductor substrate 8 constitute(s) the at least one through-substrate via (TSV) 12. The second end surface of each of the at least one deep marker via 14' is also exposed and removed during the removal of the bottom portion of the second semiconductor layer 80. The remaining portion(s) of the at least one at least one deep marker via 14' embedded in the semiconductor substrate 8 constitute(s) the at least one through-substrate alignment marker (TSAM) 14.

Typically, a touch-up planarization process is performed during the final stages of the removal of the bottom portion of the second semiconductor layer 80 to provide a substantially planar surface, which is herein referred to as a recessed second surface 9', located on an opposite side of the first surface 7 of the semiconductor substrate 8. The touch-up planarization process is a planarization process is performed at a relatively slow rate of removal to provide a smooth surface. A first end surface of each of the at least one at least one through-substrate via (TSV) 12 is substantially coplanar with the first surface 7 of the semiconductor substrate 8. A second end surface of each of the at least one through-substrate via (TSV) 12 is substantially coplanar with the recessed second surface 9' of the semiconductor substrate 8. Likewise, a first end surface of each of the at least one at least one through-substrate alignment marker (TSAM) 14 is substantially coplanar with the first surface 7 of the semiconductor substrate 8. A second end surface of each of the at least one through-substrate alignment marker (TSAM) 14 is substantially coplanar with the recessed second surface 9' of the semiconductor substrate 8. The at least one through-substrate via (TSV) 12 and the at least one through-substrate alignment marker (TSAM) 14 comprise the same conductive material, and are laterally surrounded by the dielectric liners 10.

Typically, each of the at least one through-substrate via (TSV) 12 and the at least one through-substrate alignment marker (TSAM) 14 has a substantially the same horizontal cross-sectional shape irrespective of the height of the horizontal cross-section. Some dependency of the horizontal cross-sectional area on the height of the horizontal cross-section due to a small taper in the sidewalls of the at least one through-substrate via (TSV) 12 and the at least one through-substrate alignment marker (TSAM) 14 may be present. Preferably, the at least one through-substrate alignment marker (TSAM) 14 provides enough optical contrast against surrounding areas in the first surface 7 and the recessed second surface 9' for alignment in a lithographic stepper during subsequent processing steps. Preferably, the horizontal cross-sectional shape of the at least one through-substrate alignment marker (TSAM) 14 includes a directional shape such as a crosshair to facilitate alignment of a die in lithographic processing steps.

Figure 9:
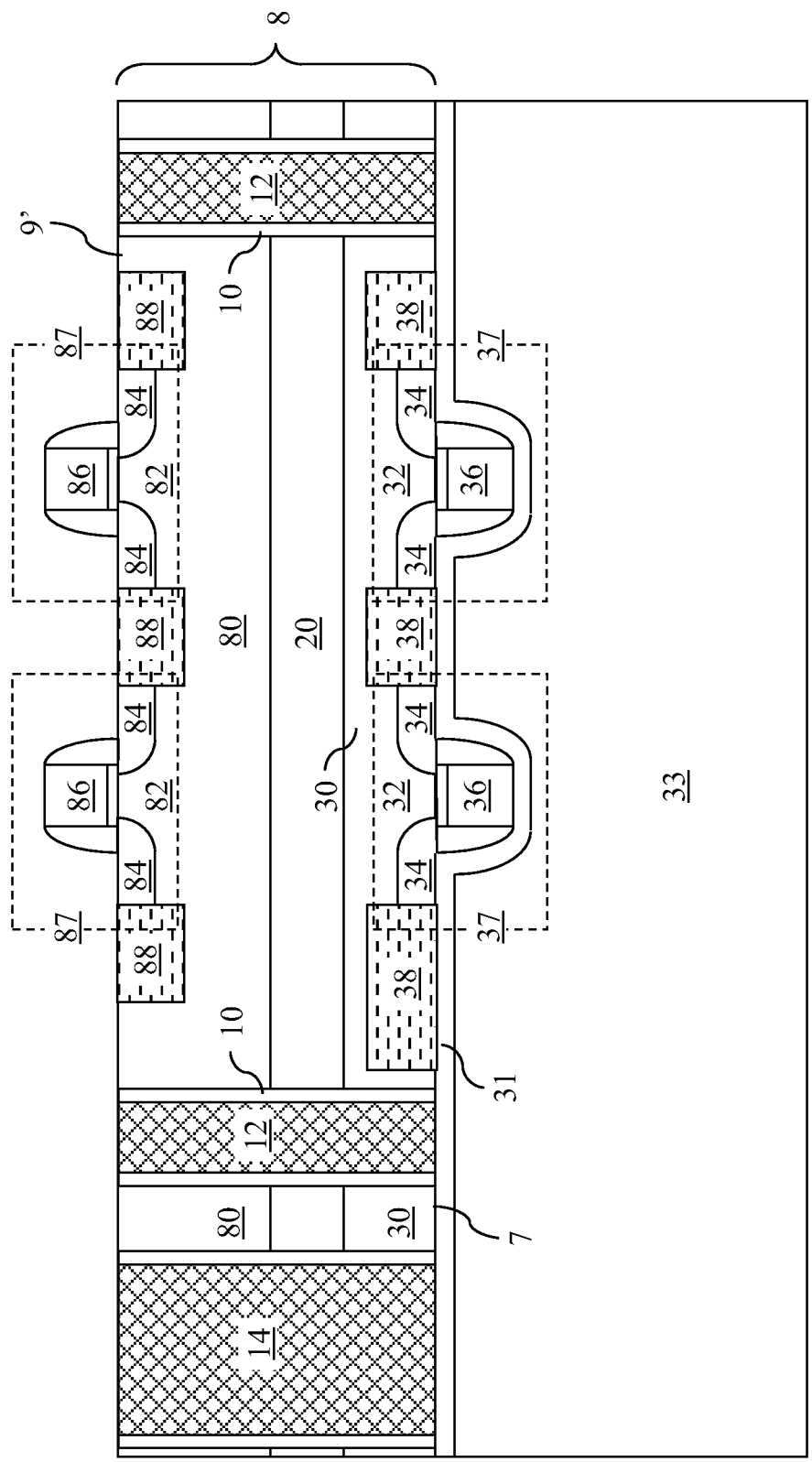
FIG. 9 is a vertical cross-sectional view of the exemplary semiconductor structure after formation of second semiconductor devices according to the present invention.

Referring to FIG. 9, at least one second semiconductor device 87 is formed on the recessed second surface 9' of the semiconductor substrate 8. The at least one second semiconductor device 87 may include a field effect transistor, a bipolar transistor, a diode, a capacitor, a resistor, an inductor, a varactor, or a combination thereof. For example, the at least one second semiconductor device 87 may include second field effect transistors, each of which include a second body region 82, second source and drain regions 84, and a second gate electrode 86. Dielectric gate spacers may be formed as needed. Each second body region 82 is a portion of the second semiconductor layer 80. The second semiconductor layer 80 may include p-doped semiconductor wells or n-doped semiconductor wells. Such doped semiconductor wells have a different dopant concentration than other portions of the second semiconductor layer 80.

Second gate dielectrics and second gate electrodes 86 may be formed by deposition of a gate dielectric layer and a gate electrode layer, followed by lithographic patterning. The second source and drain regions 84 may be formed by employing block level masks and ion implantation of electrical dopants, i.e., p-type dopants and n-type dopants. The second gate spacers may be formed in the same manner as the first gate spacers formed at the step corresponding to FIG. 5.

Preferably, an activation anneal of implanted dopants is performed at this step. During the activation anneal, the dopants in the first source and drain regions 34 and in the second source and drain regions 84 are activated simultaneously. By performing the activation anneal at this step instead of at an earlier step, the effect of thermal cycling on the dopant distribution in the first source and drain regions 34 is limited to a single activation anneal instead of two.

Figure 10:
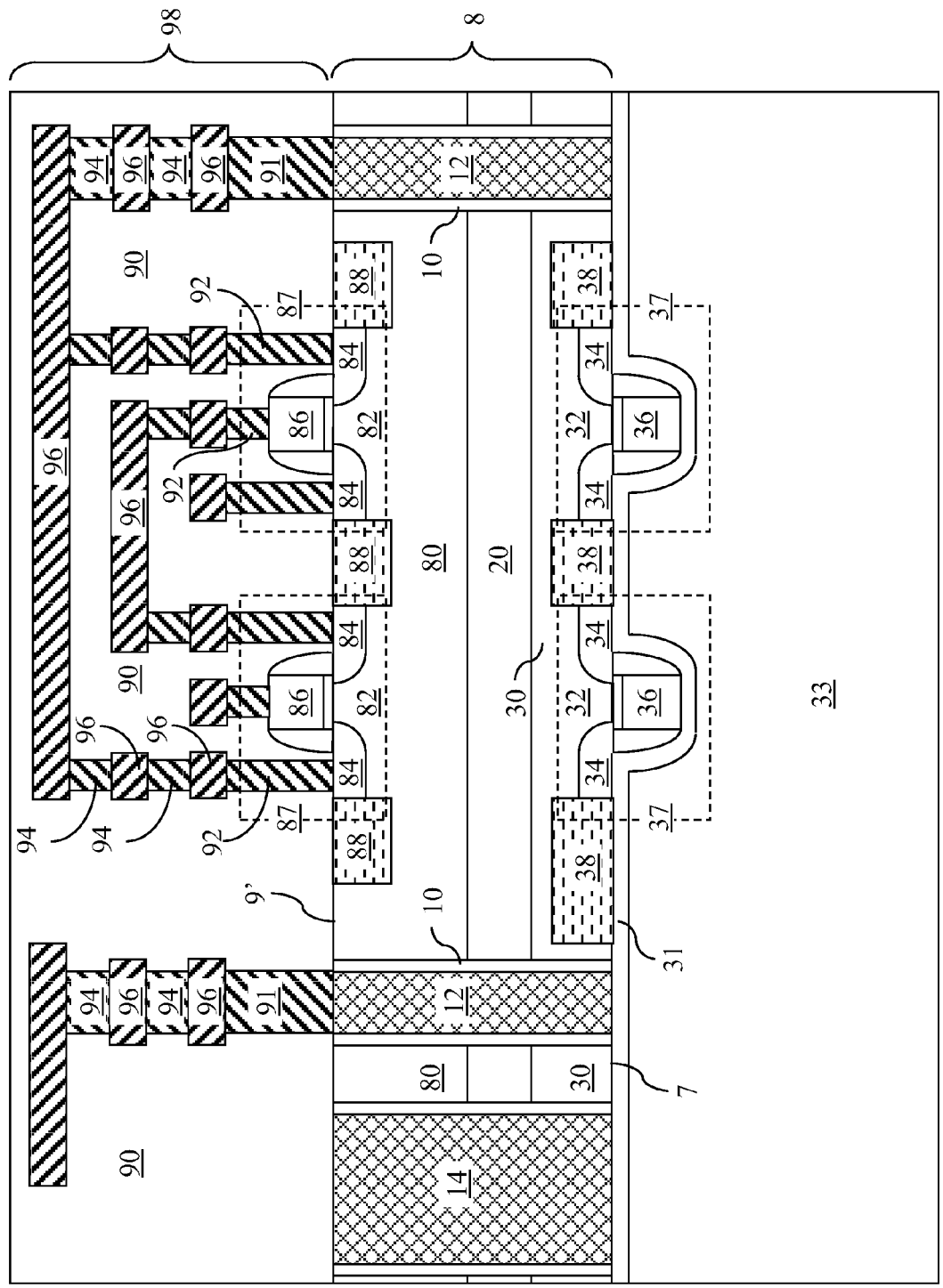
FIG. 10 is a vertical cross-sectional view of the exemplary semiconductor structure after formation of second metal interconnect structures and second dielectric material layers according to the present invention.

Referring to FIG. 10, various second metal interconnect structures are formed on the recessed second surface 9' and the at least one second semiconductor device 87. Second dielectric material layers 90 are also formed on the recessed second surface 9' and the at least one second semiconductor device 87 such that the various second metal interconnect structures are embedded in the second dielectric material layers 90.

The various second metal interconnect structures include at least one second TSV-contacting via 91 having an end surface that abuts a second end surface of the at least one TSV 12, at least one second device-contact level via 92 that abuts one of the electrical nodes of the at least one second semiconductor device 87, second wiring-level vias 94 that provide vertical wiring of circuits and does not abut the recessed second surface 9' or the at least one second semiconductor device 87, and second wiring-level metal lines 96 that provide horizontal wiring of circuits. All of the second metal interconnect structures (91, 92, 94, 96) are located on the side of the recessed second surface 9' of the semiconductor substrate 8, i.e., are closer to the recessed second surface 9' than to the first surface 7.

The second metal interconnect structures (91, 92, 94, 96) includes a metallic material such as Cu, W, Al, Ta, Ti, WN, TaN, TiN, or a combination thereof. The second dielectric material layers 90 may include undoped silicate glass (USG), phosphosilicate glass (PSG), borosilicate glass (BSG), borophosphosilicate glass (BPSG), fluorosilicate glass (FSG), spin-on glass (SOG), organosilicate glass (OSG), CVD low-k dielectric material, spin-on low-k dielectric material, or a combination thereof. The second metal interconnect structures (91, 92, 94, 96) and the second dielectric material layers 90 are collectively referred to as second metal interconnect assembly 98.

Figure 11:
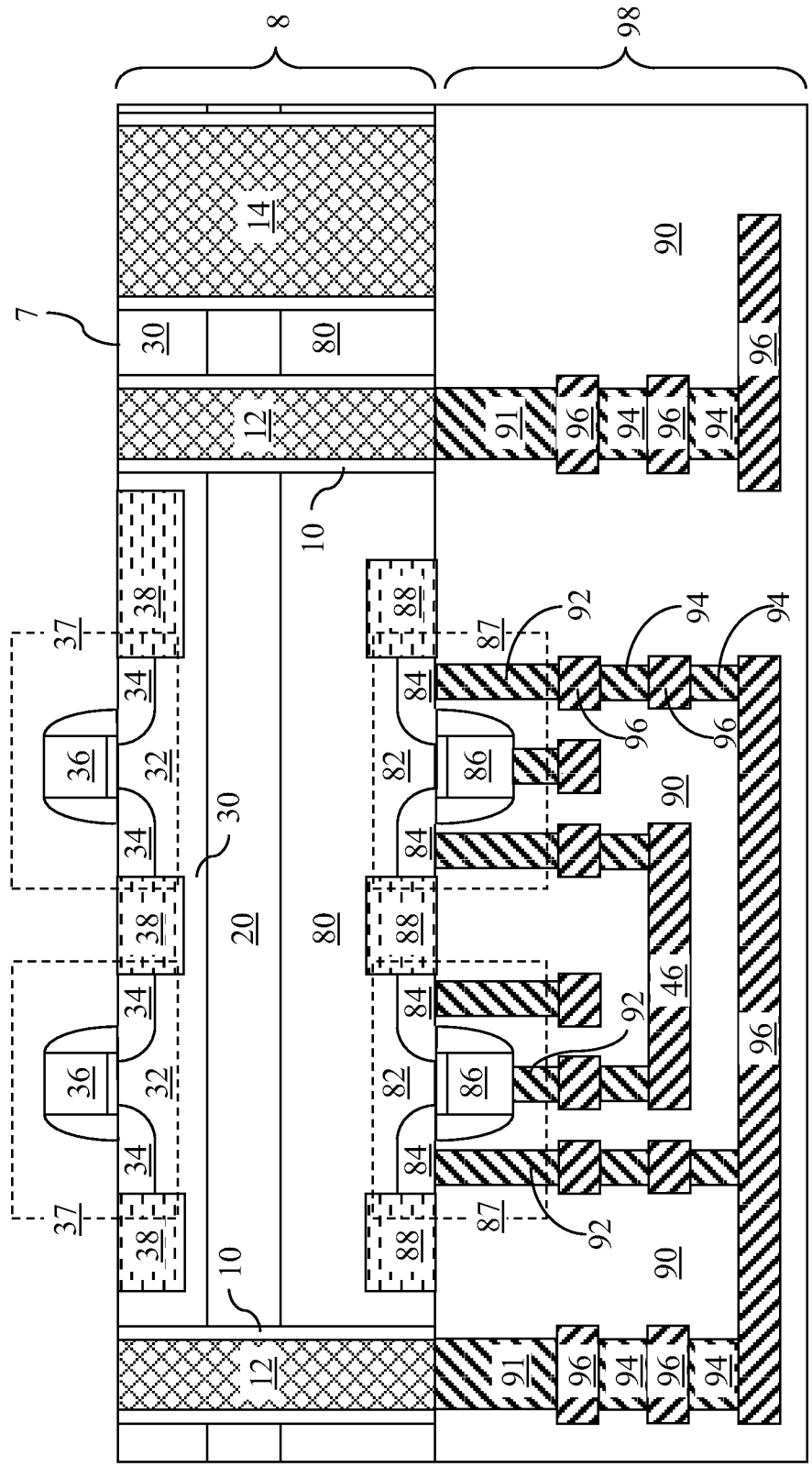
FIG. 11 is a vertical cross-sectional view of the exemplary semiconductor structure after removal of the disposable material layer and the disposable dielectric capping layer according to the present invention.

Referring to FIG. 11, the exemplary semiconductor structure is flipped upside down again so that the semiconductor substrate 8 is located above the second metal interconnect assembly 98. The disposable material layer 33 and the disposable dielectric capping layer 31 are removed to expose the first surface 7 of the semiconductor substrate 8. For example, the disposable material layer 33 may be removed selective to the disposable dielectric capping layer 31 by a recess etch, grinding, polishing, wet etch, or a combination thereof. If the disposable material layer 33 comprises polysilicon, a silicon-containing semiconductor material, a germanium-containing semiconductor material, a compound-semiconductor-containing semiconductor material, or a combination thereof, a wet etch or a dry etch that removes the disposable material layer 33 selective to the material of the disposable dielectric capping layer 31 may be employed. The disposable dielectric capping layer 31 is subsequently removed selective to the material of the first semiconductor layer 30 to expose the first surface 7 of the semiconductor substrate 8.

Figure 12:
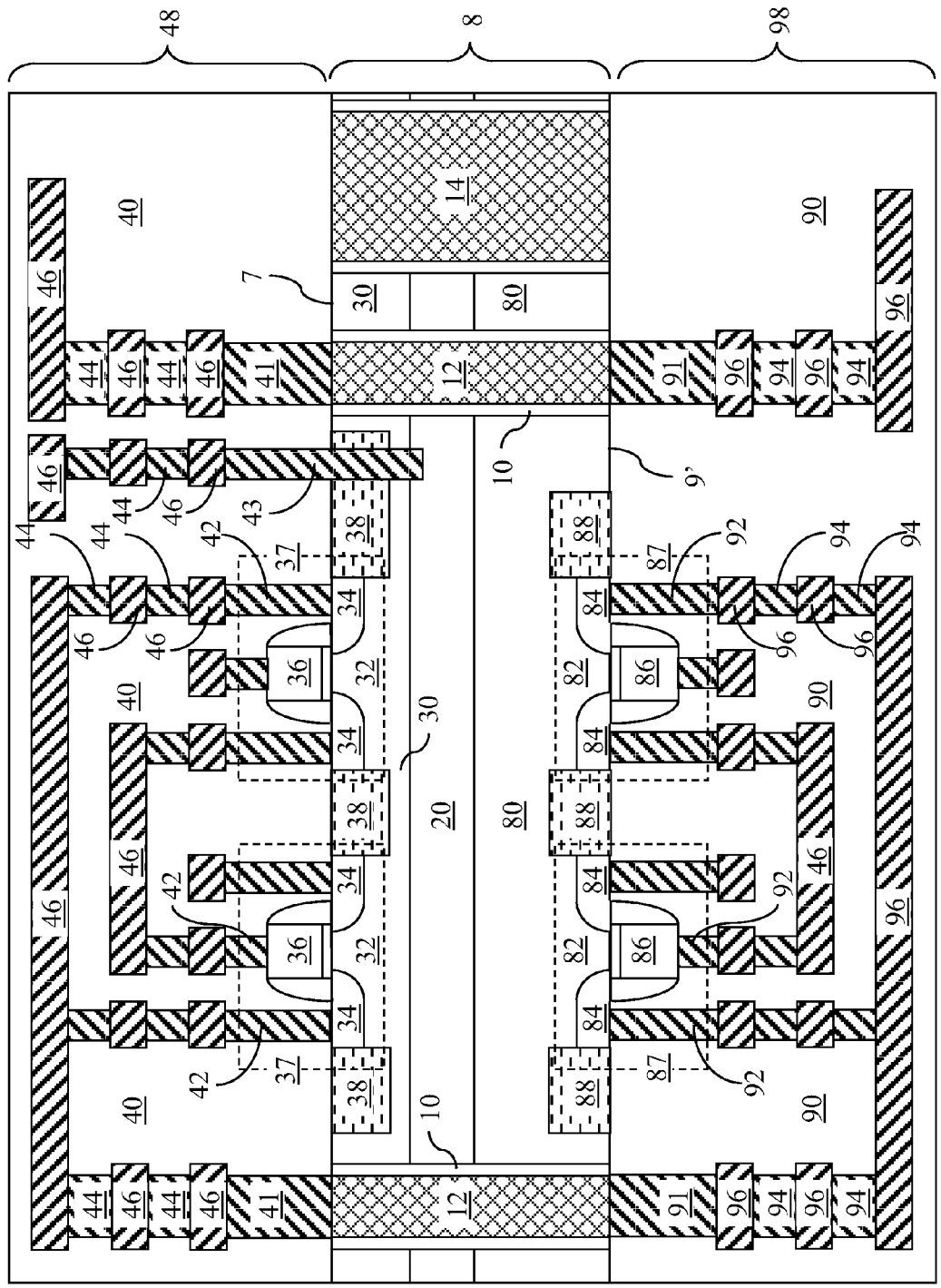
FIG. 12 is a vertical cross-sectional view of the exemplary semiconductor structure after formation of first metal interconnect structures and first dielectric material layers according to the present invention.

Referring to FIG. 12, various first metal interconnect structures are formed on the first surface 7 and the at least one first semiconductor device 37. First dielectric material layers 40 are also formed on the first surface 7 and the at least one first semiconductor device 37 such that the various first metal interconnect structures are embedded in the first dielectric material layers 40.

The various first metal interconnect structures include at least one first TSV-contacting via 41 having an end surface that abuts a first end surface of the at least one TSV 12, at least one first device-contact level via 42 that abuts one of the electrical nodes of the at least one first semiconductor device 37, first wiring-level vias 44 that provide vertical wiring of circuits and does not abut the first surface 7 or the at least one first semiconductor device 37, and first wiring-level metal lines 46 that provide horizontal wiring of circuits.

Further, at least one body contact feedthrough via 43 is formed through the first semiconductor layer 30. The at least one body contact feedthrough via 43 may be formed through one of the first STI structures 38 to provide enhanced electrical isolation from the first semiconductor layer 30. The at least one body contact feedthrough via 43 directly contacts the buried conductor layer 20 and at least one of the other first metal interconnect structures such as a first wiring-level metal lines 46. The at least one body contact feedthrough via 43 may comprise a doped semiconductor material or a metallic material. All of the first metal interconnect structures (41, 42, 44, 46) and the at least one body contact feedthrough via 43 are located on the first surface of the semiconductor substrate 8, i.e., are closer to the first surface 7 than to the recessed second surface 9'.

The first metal interconnect structures (41, 42, 44, 46) includes a metallic material such as Cu, W, Al, Ta, Ti, WN, TaN, TiN, or a combination thereof. The first dielectric material layers 40 may comprise any of the material that may be employed for the second dielectric material layers 90. The first metal interconnect structures (41, 42, 44, 46) and the first dielectric material layers 40 are collectively referred to as first metal interconnect assembly 48.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:
   forming a deep conductive via in a semiconductor substrate, wherein a first end surface of said deep conductive via is substantially coplanar with said first surface of said semiconductor substrate, and wherein a second end surface of said deep conductive via is embedded in said semiconductor substrate;
   forming a through-substrate via (TSV) in said semiconductor substrate by polishing said semiconductor substrate, wherein a remaining portion of said deep conductive via constitutes said TSV;
   forming a first semiconductor device on a first surface of the semiconductor substrate;
   forming a disposable material layer on said first semiconductor device;
   forming a second semiconductor device on a second surface of said semiconductor substrate, wherein said second surface is located opposite to said first surface; and
   removing said disposable material layer after forming said second semiconductor device.

2. The method of claim 1, wherein said through-substrate via (TSV) extends from said first surface to said second surface, wherein a first end surface of said TSV is substantially coplanar with said first surface and a second end surface of said TSV is substantially coplanar with said second surface.

3. The method of claim 1, further comprising forming a through-substrate alignment marker (TSAM) having a substantially constant cross-sectional area between said first surface and said second surface and having optical contrast against surrounding areas in said first surface and said second surface for alignment in a lithographic stepper.

4. The method of claim 1, further comprising forming a disposable dielectric capping layer directly on said first semiconductor device, wherein said disposable material layer comprising a different material than said disposable dielectric capping layer is formed directly on said dielectric capping layer.

5. The method of claim 1, further comprising:
   forming first metal interconnect structures on said first semiconductor device, wherein said first metal interconnect structures are embedded in first dielectric material layers; and forming second metal interconnect structures on said second semiconductor device, wherein said second metal interconnect structures are embedded in second dielectric material layers.

6. The method of claim 5, further comprising:
forming a buried conductive layer in said semiconductor substrate between said first surface and said second surface; and
forming a body contact feedthrough via contacting said buried conductive layer and at least one of said first metal interconnect structures.

7. The method of claim 6, wherein said semiconductor substrate comprises a first semiconductor layer located on a first surface of said buried conductive layer and a second semiconductor layer located on a second side of said buried conductive layer, wherein said second side is located on an opposite to said first surface, wherein said first semiconductor layer, said second semiconductor layer, and said buried conductive layer comprise a same semiconductor material, and wherein said first semiconductor layer, said second semiconductor layer, and said buried conductive layer are single crystalline and epitaxially aligned amongst one another.

8. A method of forming a semiconductor structure comprising:
forming a through-substrate via (TSV) in a semiconductor substrate;
forming a through-substrate alignment marker (TSAM) having a substantially constant cross-sectional area between a first surface of said semiconductor substrate and a second surface of said semiconductor substrate, wherein said second surface is located opposite to said first surface, and said TSAM has optical contrast against surrounding areas in said first surface and said second surface for alignment in a lithographic stepper;
forming a first semiconductor device on said first surface;
forming a disposable material layer on said first semiconductor device;
forming a second semiconductor device on said second surface; and
removing said disposable material layer after forming said second semiconductor device.

9. The method of claim 8, further comprising:
forming a deep conductive via in said semiconductor substrate, wherein a first end surface of said deep conductive via is substantially coplanar with said first surface of said semiconductor substrate, and wherein a second end surface of said deep conductive via is embedded in said semiconductor substrate; and
polishing said semiconductor substrate, wherein a remaining portion of said deep conductive via constitutes said TSV.

10. The method of claim 9, wherein said through-substrate via (TSV) extends from said first surface to said second surface, wherein a first end surface of said TSV is substantially coplanar with said first surface and a second end surface of said TSV is substantially coplanar with said second surface.

11. The method of claim 8, further comprising forming a disposable dielectric capping layer directly on said first semiconductor device, wherein said disposable material layer comprising a different material than said disposable dielectric capping layer is formed directly on said dielectric capping layer.

12. The method of claim 8, further comprising:
forming first metal interconnect structures on said first semiconductor device, wherein said first metal interconnect structures are embedded in first dielectric material layers; and
forming second metal interconnect structures on said second semiconductor device, wherein said second metal interconnect structures are embedded in second dielectric material layers.

13. The method of claim 12, further comprising:
forming a buried conductive layer in said semiconductor substrate between said first surface and said second surface; and
forming a body contact feedthrough via contacting said buried conductive layer and at least one of said first metal interconnect structures.

14. The method of claim 13, wherein said semiconductor substrate comprises a first semiconductor layer located on a first surface of said buried conductive layer and a second semiconductor layer located on a second side of said buried conductive layer, wherein said second side is located on an opposite to said first surface, wherein said first semiconductor layer, said second semiconductor layer, and said buried conductive layer comprise a same semiconductor material, and wherein said first semiconductor layer, said second semiconductor layer, and said buried conductive layer are single crystalline and epitaxially aligned amongst one another.

15. A method of forming a semiconductor structure comprising:
forming a through-substrate via (TSV) in a semiconductor;
forming a first semiconductor device on a first surface of the semiconductor substrate;
forming a disposable dielectric capping layer directly on said first semiconductor device,
forming a disposable material layer comprising a different material than said disposable dielectric capping layer on said first semiconductor device and directly on said dielectric capping layer;
forming a second semiconductor device on a second surface of said semiconductor substrate, wherein said second surface is located opposite to said first surface; and
removing said disposable material layer after forming said second semiconductor device.

16. The method of claim 15, further comprising:
forming a deep conductive via in said semiconductor substrate, wherein a first end surface of said deep conductive via is substantially coplanar with said first surface of said semiconductor substrate, and wherein a second end surface of said deep conductive via is embedded in said semiconductor substrate; and
polishing said semiconductor substrate, wherein a remaining portion of said deep conductive via constitutes said TSV.

17. The method of claim 16, wherein said through-substrate via (TSV) extends from said first surface to said second surface, wherein a first end surface of said TSV is substantially coplanar with said first surface and a second end surface of said TSV is substantially coplanar with said second surface.

18. The method of claim 15, further comprising forming a through-substrate alignment marker (TSAM) having a substantially constant cross-sectional area between said first surface and said second surface and having optical contrast against surrounding areas in said first surface and said second surface for alignment in a lithographic stepper.

19. The method of claim 15, further comprising:
forming first metal interconnect structures on said first semiconductor device, wherein said first metal interconnect structures are embedded in first dielectric material layers; and
forming second metal interconnect structures on said second semiconductor device, wherein said second metal interconnect structures are embedded in second dielectric material layers.

20. The method of claim 19, further comprising:
forming a buried conductive layer in said semiconductor substrate between said first surface and said second surface; and
forming a body contact feedthrough via contacting said buried conductive layer and at least one of said first metal interconnect structures.

* * * * *